US009859890B1

(12) United States Patent
Maxey et al.

(10) Patent No.: US 9,859,890 B1
(45) Date of Patent: Jan. 2, 2018

(54) METHOD OF PREVENTING UNAUTHORIZED USE OF ANALOG AND MIXED-SIGNAL INTEGRATED CIRCUITS

(71) Applicant: BAE SYSTEMS Information and Electronic Systems Integration Inc., Nashua, NH (US)

(72) Inventors: Christopher A Maxey, Arlington, VA (US); Thomas E Collins, III, Tyngsboro, MA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 15/455,235

(22) Filed: Mar. 10, 2017

(51) Int. Cl.
| H03K 19/00  | (2006.01) |
| H03K 19/003 | (2006.01) |
| H01L 23/00  | (2006.01) |
| H03L 7/08   | (2006.01) |

(52) U.S. Cl.
CPC ......... *H03K 19/003* (2013.01); *H01L 23/576* (2013.01); *H03L 7/08* (2013.01)

(58) Field of Classification Search
None
See application file for complete search history.

(56) References Cited

U.S. PATENT DOCUMENTS

| 8,378,710 B1* | 2/2013 | Al-Kadi ........... G06K 19/07372 |
| | | 326/15 |
| 2015/0052622 A1* | 2/2015 | Cabler ................. G06F 21/558 |
| | | 726/34 |

OTHER PUBLICATIONS

Yousra M Alkabani and Farinaz Koushanfar, Active Hardware Metering for Intellectual Property Protection and Security, 16th USENIX USENIX, Association Security Symposium, pp. 291-306.
Alex Baumgarten, Akhilesh Tyagi, and Joseph Zambreno, Preventing IC Piracy Using Reconfigurable Logic Barriers, 0740-7475/10/ $26.00 66 c 2010 IEEE, Copublished by the IEEE CS and the IEEE CASS, IEEE Design & Test of Computers, Jan./Feb. 2010, pp. 66-75.
Ujjwal Guin, Ke Huang, Ke Huang, John M. Carulli, Jr., Mohammad Tehranipoor, and Yiorgos Makris, Counterfeit Integrated Circuits: A Rising Threat in the Global Semiconductor Supply Chain, Proceedings of the IEEE, vol. 102, No. 8, Aug. 2014, pp. 1207-1228.

* cited by examiner

*Primary Examiner* — Anh Tran
(74) *Attorney, Agent, or Firm* — Maine Cernota & Rardin

(57) ABSTRACT

A method for protecting analog or mixed signal ICIP uses adjustment requirements of analog circuits to provide an obfuscated mechanism for preventing unauthorized use of an analog or mixed-signal IC ("AIC") by disabling the AIC until application of an adjustment signal that is within a narrow enabling subrange. Embodiments significantly increase the adjustment range beyond the enabling subrange, and/or omit AIC tuning outputs that are not required for operation of the IC. Embodiments include "clipping" circuits that render the AIC outputs unresponsive to tuning signals outside of the enabling subrange. Information regarding the enabling subrange and/or a separate enabling IC can be provided to authorized users, and/or enabling bits of a digital adjustment input can be permanently set by the ICIP owner after AIC manufacture. The ICIP can be further protected by a security feature that can be unique to each AIC, and/or by using a two-foundry production method.

22 Claims, 14 Drawing Sheets

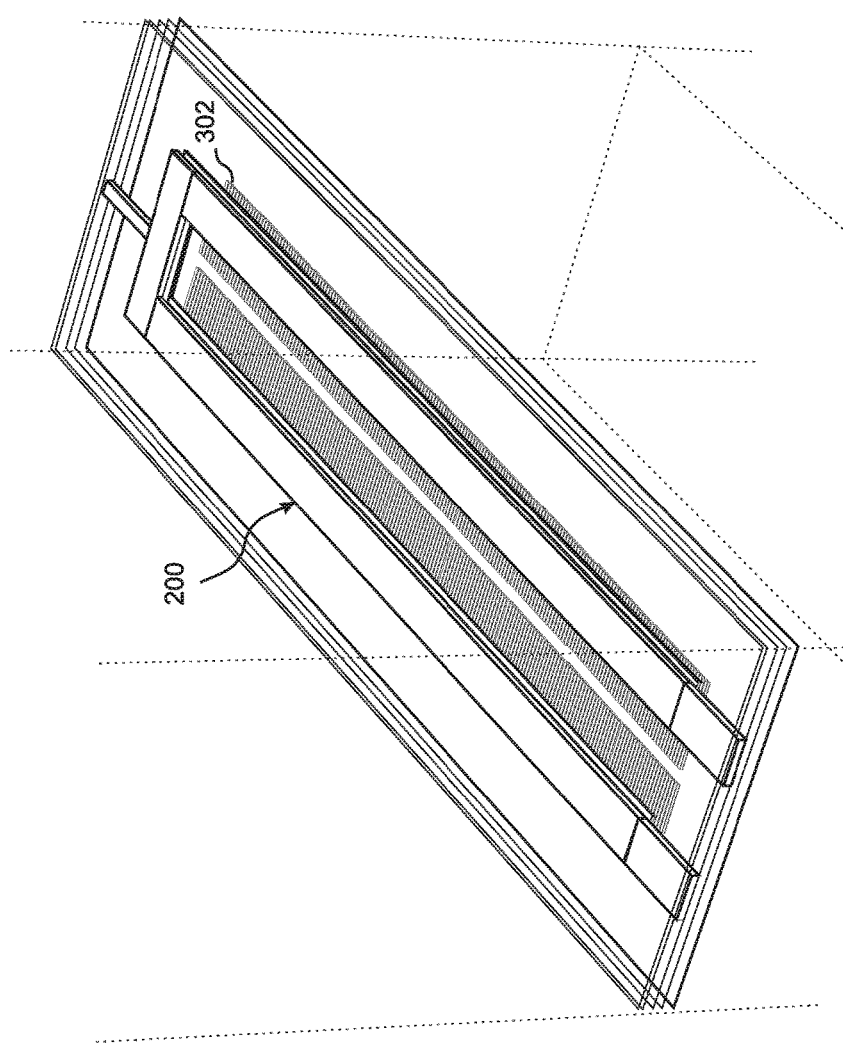

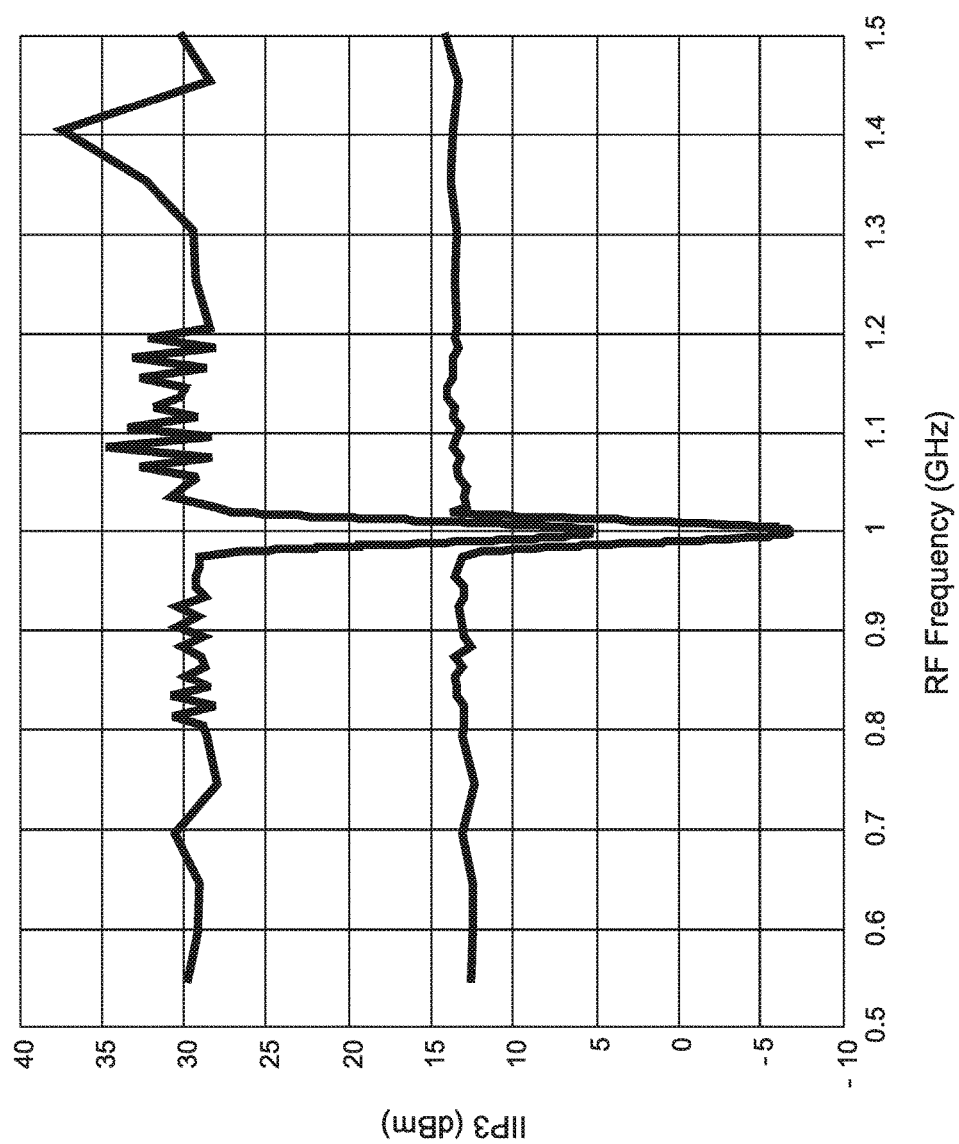

METHOD OF PREVENTING UNAUTHORIZED USE OF ANALOG AND MIXED-SIGNAL INTEGRATED CIRCUITS

FIELD OF THE DISCLOSURE

The present disclosure relates to methods of preventing misappropriation of integrated circuit intellectual property ("ICIP"), and more particularly, to methods of preventing unauthorized use of ICIP.

BACKGROUND

Designing the mask layout for an integrated circuit ("IC") is a time consuming and costly process, which is considered to IC designers to be a "non-recoverable expense," or "NRE," which must be recovered by increases to the per-unit cost of the ICs above their actual cost per unit of manufacture. Accordingly, it is important for IC designers to ensure that competitors are not able to duplicate their designs without incurring the NRE expense, so as to market them at unfairly reduced costs.

In general, a "mask work" is a two or three-dimensional layout or topography of an integrated circuit, i.e. the arrangement on a chip of semiconductor devices such as transistors and passive electronic components such as resistors and interconnections. Because of the functional nature of a mask layout, the functionality cannot be effectively protected under copyright law. Similarly, because a mask layout is not clearly protectable subject matter under patent law, mask works also cannot be effectively protected by patents. Some national governments have been granting copyright-like exclusive rights conferring time-limited exclusivity to reproduction of mask works. However, current legal protections are insufficient, such that a strong need exists for IC designers to find practical methods of protecting their IC intellectual property ("ICIP").

Changes to the chip fabrication industry that have led to a flattening of the once-vertical integrated circuit ("IC") supply chain have made it much more difficult to protect ICIP. In the past, IC design and fabrication were typically handled by the same entity, because the cost to build a foundry, though expensive, was a reasonable investment. This enabled IC designers to maintain their ICIP as a trade secret. However, decreasing feature sizes and times to market, coupled with demands for lower power, high-performance ICs, as well as for specialized, lower production run ICs, have made it prohibitively expensive for most IC designers to establish a full-scale foundry. Instead, nearly all IC designers outsource their IC production to third-party IC manufacturers or "foundries."

These contract IC foundries, originally driven by inexpensive labor, have established themselves throughout the world, and especially in Asia. This paradigm shift has created new opportunities for smaller and more specialized organizations to design IC solutions, and even to design partial IC solutions that can be licensed for incorporation into third party IC designs. However, this shift to fabrication outsourcing, especially to offshore foundries, has given rise to a serious threat that ICIP will be abused by potentially untrusted foundries, especially due to overproduction, whereby the cost per additional unit is very low, and the sale of the overproduced items is in direct competition with the designer. A recent survey on the semiconductor industry by Semiconductor Equipment and Materials International (SEMI) reports that 90% of IC designers have experienced IP infringement, with 54% reporting it as serious or extremely serious.

Several solutions for counterfeit protection and Trojan detection have been developed for digital ICIP. An example is presented in FIGS. 1A and 1B. In FIG. 1A, a complex digital integrated circuit 100 is conceptually represented as including a large number of logical units that are interconnected to form a functioning circuit. For simplicity, only two of the interconnections 102, 104 are shown. One method of preventing ICIP piracy is to include additional elements such as the "OR" gates 108, 110 included in modified circuit 106 of FIG. 1B. According to this approach, the additional components 108, 110 re-route or, in the case of FIG. 1B, enable or disable, certain interconnections 102, 104 that are necessary for the circuit 106 to operate. Accordingly, additional inputs 112, 114 are provided, and the chip 106 will not function unless the required digital signals are applied to the inputs 112, 114. Functionally, this means that an enabling code or "key" must be applied to these additional inputs 112, 114 so as to allow the chip 106 to be used. By arranging for a first foundry to manufacture the ICs, and a second foundry to manufacture separate chips, such as PROMs, that contain the (possibly encrypted) key, a designer can inhibit piracy by ensuring that only authorized users receive both.

Note that while FIG. 1B illustrates the use of OR gates to enable signal paths, in general the protection scheme can be designed such that it is necessary to disable certain extraneously added signal paths so as to allow the circuit to function. Of course, other types of logic units can be added, and in some cases additional functionality of circuits that are already present may be utilized in the same way.

Another approach for protecting digital ICIP is to include additional circuitry in the IC design that results in a large number of possible initial states for the IC, and then to use a physically unclonable function ("PUF") of the chip, which will differ between chips due to manufacturing fluctuations, to cause each chip to be initiated in an unpredictable state. According to this approach, the authorized user initiates the chip and reports the initial state to the IC designer, who then uses proprietary knowledge of the IC circuit to determine what inputs are needed to transition the chip to the correct initial state. This "key" is then provided to the authorized user, which may be implemented in software, by fusing appropriate circuits in the IC, and/or by implementing the key in a separate chip.

These and other approaches to protecting ICIP depend upon creating a large number of configurations for the IC, of which only one, or only a very few, of the configurations will allow the circuit to operate. As such, these solutions are sometimes described in terms of creating a "finite state engine" ("FSE"), for which the degree of protection depends on the number of states of the FSE.

Approaches for protecting digital ICIP generally depend on adding transistors and gates to the IC in sufficient numbers to provide a large enough number of FSE states to provide adequate protection. These approaches are made practical by the large number of transistors and digital logic gates that are included in the IC circuit itself, such that the additional transistors and/or gates that are needed to implement the protection scheme will not unduly increase the complexity and cost of the IC. Furthermore, these solutions benefit from "obfuscation," whereby it is prohibitively difficult for a competitor to determine which of the very large number of logic gates and transistors are extraneous to the functioning of the IC circuit, and are provided only for IC protection. This obfuscation helps to prevent a competitor from making small modifications to the mask layout that might otherwise disable the protection while maintaining the functionality of the circuit.

While existing approaches can be effective in preventing piracy of digital ICIP, they are not readily adapted to protecting analog and mixed signal ICIP. Because of the large NRE for many analog and mixed-signal ICs, they are highly tempting targets for piracy if the manufacturing is implemented by an untrusted foundry or otherwise misappropriated. Accordingly, there is considerable incentive both for adversaries to steal analog and mixed signal ICIP, and for designers to protect their analog and mixed signal ICIP. Unfortunately, in contrast to digital ICIP, analog and mixed signal ICIP circuits comprise several orders of magnitude fewer transistors and logic gates. As a result, the approaches for preventing unauthorized use that work well for digital ICIP are not readily adapted to analog and mixed signal ICIP, because the addition of sufficient transistors and gates to provide enough FSE states, i.e. a large enough "key," would result in an unacceptable increase in the complexity and cost of the IC, and also because the circuit includes too few transistors and gates to provide adequate obfuscation for the additional transistors and gates that would be needed.

What is needed, therefore, is a method for preventing unauthorized use of analog and mixed signal ICIP.

SUMMARY

A method and system are disclosed for preventing unauthorized use of analog and mixed signal ICIP. Rather than adding additional digital transistors and gates to create a finite state engine ("FSE") having the required number of states, embodiments of the disclosed method makes use of the requirements for correct tuning of many tunable circuits included in analog and mixed-circuit ICs (referred to herein as "AICs"), including filters, oscillators, and other analog circuits, to create a large number of FSE states, and thereby to provide an obfuscated mechanism for disabling an analog or mixed-signal IC until a proper enabling input or "key" is provided. The analog or mixed-signal ICIP is thereby protected with little if any added circuitry, and in a manner that is difficult for a competitor to analyze and defeat.

AICs typically include a plurality of tuned analog circuits, including tuned passive circuits such as filters, and tuned active circuits such as phase-locked loops (PLLs), that must be set to a required frequency or otherwise adjusted to a specific setting so as to enable the AIC to function properly. Typically, the AIC is designed such that each tuned element is set as close to its optimal value as possible. However, due to the highly variable nature of advanced deep sub-micron silicon processes, the tuning of these analog circuits will vary slightly from one IC to the next. For this reason, it is very common for analog and mixed signal ICs to include mechanisms that enable each of the tuned analog circuits to be finely adjusted over a limited range, so that the performance of each IC is optimized. For example, a phase locked loop ("PLL") may only exhibit a required output frequency when a passive tank circuit is correctly adjusted by manipulating artificially tunable dielectric constants of passive components, digitally manipulating a bank of switchable capacitors, or continuously tuning a bank of analog varactors.

This fine-tuning of an AIC is typically a simple operation to implement, because the analog circuits are designed to be close to their intended settings, such that the AIC will be functional, and the outputs of the AIC will be responsive, even before any adjustments are made. Often, the process is even further simplified by making outputs of individual analog circuits available for monitoring even if the outputs are not otherwise needed. It therefore remains necessary only to monitor the response of each output of the AIC as each setting is adjusted until the outputs are optimized.

Embodiments of the invention deviate from this typical approach by significantly increasing the adjustment ranges of the tuned analog circuits, and/or by omitting any outputs of analog circuits that are only useful for tuning and are not required for operation of the AIC. As a result, the output or outputs of the AIC do not vary significantly as a function of the tuning inputs until the tuning inputs are brought close to their required values. Embodiments further deviate from typical design practices in that the pre-adjustment settings for the tuned analog circuits are purposely offset from their required values, so that the AIC does not function until an enabling adjustment signal is applied that brings the tuning inputs close to their required values. As a result, spoofing of the required adjustment settings is rendered virtually impossible without significant brute force effort on the part of the exploiter. Such an effort is likely to be on par with a ground-up re-design of the AIC.

Various embodiments further include "clipping" circuits that "pin" the outputs of analog circuits to their maximum or minimum values except when they are close to their tuned states, thereby eliminating any small variability in output that might otherwise be observed even when the circuit is badly mistuned.

In embodiments, information regarding the enabling adjustment input is delivered to the authorized user via encryption mechanisms so as to ensure that only the authorized user has full access to the AIC. In other embodiments, a separate chip that generates the required enabling adjustment input is produced by an unrelated foundry and provided to the authorized user. This two AIC approach ensures physical separation of the "lock" (included in the AIC) and "key" (included on a separate PROM or other chip).

Still other embodiments implement the highest order bits of digital adjustment inputs for some or all of the analog adjustments as "fused" or "write-once" bits, whereby these high order bits need not be, and indeed cannot be, changed once they are initially written. For example, the AIC designer can obtain the AICs from an untrusted foundry, and then set the high order fused bits to their required values before shipping the AICs to end users, thereby placing each adjustment close to its required value and requiring only fine-tuning by the end user. This approach removes any requirement for end-users to support additional, unneeded adjustment bits, while at the same time imposing a significant penalty on any unauthorized party who might attempt to determine the required adjustment values by means of a "brute-force" search.

The difficulty of a brute force search for the required adjustment values can be still further increased by "scrambling" the bits of a digital adjustment input that controls the various analog adjustments. Rather than simply arranging the adjustment bits in ascending or descending order, the bits can be arranged in a mixed order, so that continuous adjustment of tuning parameters is impossible unless the bit order is known. This approach does not impede normal adjustment of the AIC by authorized end users who know how the digital adjustment bits are ordered. However, if an unauthorized party is not aware a priori of the arrangement order of the adjustment bits, then even if by chance a certain setting is found for which some response from the AIC is obtained, considerable additional work will still be required before the ordering of the bits is established and the digital adjustment can be continuously varied and optimized.

For applications where some end users are not trusted and/or distribution of AICs to end users cannot be tightly controlled, embodiments include additional disabling features that depend upon "physically unclonable functions" ("PUF"s) that naturally vary from one AIC to the next. For example, in some of these embodiments the analog circuit adjustments are disabled unless a specific digital key is applied to the AIC. The required key is generated based on a value supplied by a PUF, and a key request containing a coded version of the key is provided by the AIC to the end user. It then remains for the owner of the analog or mixed signal ICIP to decode the key request and provide the unique key to the authorized user. Even if the decoded key becomes available to unauthorized parties, it cannot be used to enable counterfeit or over-produced AICs, because the key is applicable to only one specific AIC.

For embodiments that implement bit scrambling, PUF key generation, and/or any other strategy that might potentially be overcome or by-passed due to reverse engineering of the ICIP, the fabrication of the AIC can be divided into two steps, such that certain lower resolution protective features of the AIC can be omitted from the IPIC provided to a first, untrusted foundry and added instead in a second fabrication step performed by a second foundry. In particular, a top layer of the IC that scrambles the order of the adjustment bits and/or implements an encoding scheme applicable to a PUF-dependent key can be added by a second foundry to an otherwise completed wafer provided by the first, untrusted foundry. In this way, the complete ICIP is not provided to either foundry, such that reverse engineering of the protective features becomes impossible for either foundry, unless the two foundries somehow collude with each other.

In one general aspect, the present application discloses a method for preventing unauthorized use of an analog or mixed signal integrated circuit. The method includes causing an analog or mixed circuit IC ("AIC") to be produced according to an AIC design, said AIC including at least one AIC output, said AIC including an analog or mixed signal circuit having a circuit output that is adjustable by application of an adjustment signal to an adjustment input of the AIC, the adjustment input being configured to accept any adjustment signal within an adjustment signal range, the analog AIC being substantially inoperative and the AIC outputs being substantially invariant in response to applied adjustment signals that are not enabling signals, where an enabling signal is an adjustment signal that falls within an enabling subrange of the adjustment range, at least one of the AIC outputs being variable in response to applied enabling signals, and the enabling subrange being less than 10% of the adjustment range. The method further includes causing the AIC to be delivered to an authorized user, and enabling the authorized user to apply an enabling signal to the adjustment input of the AIC.

In embodiments, failure to apply an adjustment signal to the AIC is equivalent to applying a "null" adjustment signal, said null adjustment signal being outside of the enabling subrange.

In any of these embodiments, the AIC can include a plurality of adjustable analog or mixed signal circuits, all of which are adjusted by the adjustment signal. In some of these embodiments, a plurality of the analog or mixed signal circuits are interdependent, such that a corresponding AIC output is inoperative unless all of the interdependent analog or mixed-signal circuits are adjusted to within respective enabled adjustment ranges by application of the enabling signal.

In any of the above embodiments, enabling the authorized user to apply an enabling signal can include providing information to the authorized user regarding the enabling subrange. In some of these embodiments, the information regarding the enabling subrange is provided to the authorized user using a secure method.

In any of the above embodiments, enabling the authorized user to apply an enabling signal includes providing to the authorized user an enabling IC that is configured to apply an enabling signal to the AIC. In some of these embodiments, the AIC is produced by a first foundry, and the enabling IC is produced by a second foundry that is distinct from the first foundry.

In any of the above embodiments, enabling the authorized user to apply an enabling signal can include causing the AIC to be altered such that the adjustment input is only able to accept enabling signals. In some of these embodiments, the adjustment signals are digital signals, and altering the AIC includes setting selected bits of the adjustment input to fixed values.

In any of the above embodiments, the AIC can further include a clipping circuit that maintains a fixed circuit output except when an enabling signal is applied to the adjustment input.

In any of the above embodiments, the AIC can further include a security feature that increases a difficulty of determining by an unauthorized entity of the enabling subrange. In some of these embodiments, the adjustment signal is a digital signal, and the security feature includes a circuit that reorders bits of the adjustment input. In any of these embodiments where the adjustment signal is a digital signal, the security feature can cause at least one bit of the adjustment input to be settable only once by the user, after which the at least one bit remains permanently set. In any of these embodiments, the security feature can be configured to require that an enabling input be applied to the AIC, the enabling input being specific to the AIC, such that the enabling input cannot be used to enable other, nominally identical AICs. And in any of these embodiments, the security feature can include a physically unclonable feature ("PUF") of the AIC.

In any of the above embodiments, causing the analog or mixed circuit IC ("AIC") to be produced can include causing an unfinished AIC to be produced by a first foundry, and causing the unfinished AIC to be completed by a second foundry, such that the AIC design is not fully known to either the first foundry or the second foundry. In some of these embodiments, completing the unfinished AIC includes adding a security feature to the AIC that increases a difficulty of determining by an unauthorized entity of the enabling subrange.

In any of the above embodiments, the enabling signal can include a digital signal.

In any of the above embodiments, the enabling signal can include an analog signal.

And any of the above embodiments can be configured such that the enabling signal must be applied continuously during use of the AIC.

A second general aspect of the present application discloses an analog or mixed signal integrated circuit ("AIC") that inhibits unauthorized use thereof by requiring application thereto of an enabling signal. The AIC includes at least one AIC output and an analog or mixed signal circuit having a circuit output that is adjustable by application of an adjustment signal to an adjustment input of the AIC, the adjustment input being configured to accept any adjustment signal within an adjustment signal range, the analog AIC being substantially inoperative and the AIC outputs being substantially invariant in response to applied adjustment signals that are not enabling signals, where an enabling signal is an adjustment signal that falls within an enabling subrange of the adjustment range, at least one of the AIC outputs being variable in response to applied enabling signals, and the enabling subrange being less than 10% of the adjustment range.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 2A is a perspective view of a tunable PLL that is used in embodiments of the present disclosure

FIG. 3C is a graph that presents an in-band third order input interception point ("IIP$_3$") measurement for an N-path mixer-first topology used in embodiments of the present disclosure;

These and other features of the present embodiments will be understood better by reading the following detailed description, taken together with the figures herein described. The accompanying drawings are not intended to be drawn to scale. For purposes of clarity, not every component may be labeled in every drawing.

DETAILED DESCRIPTION

A method is disclosed for preventing unauthorized use of analog or mixed signal integrated circuit intellectual property ("ICIP"). Rather than adding additional digital transistors and gates to create a finite state engine ("FSE") having the required number of states, embodiments of the disclosed method take advantage of the requirement for correctly adjusting filters, oscillators, and other tuned analog circuits included in analog and mixed-circuit ICs, referred to herein as "AICs," to provide an obfuscated mechanism for disabling an AIC until a proper enabling "key" is applied to the high order bits of the tuning inputs. The analog or mixed-signal ICIP is thereby protected with little if any added circuitry, and in a manner that is difficult for a competitor to analyze and defeat.

AICs typically include a plurality of tuned analog circuits, including tuned passive circuits such as filters, and tuned-active circuits such as phase-locked loops (PLL's), that must be set to a required frequency or otherwise adjusted to a specific setting so as to enable the AIC to function properly. Typically, according to existing practices, the AIC is designed such that each tuned element is set as close to its optimal value as possible. However, due to the highly variable nature of advanced deep sub-micron silicon processes, the tuning of these analog circuits will vary slightly from one AIC to the next. For this reason, it is very common for analog and mixed signal AICs to include tuning mechanisms that enable each of the tuned analog circuits to be finely adjusted over a limited range, so that the performance of each AIC is optimized.

Figure 1A:
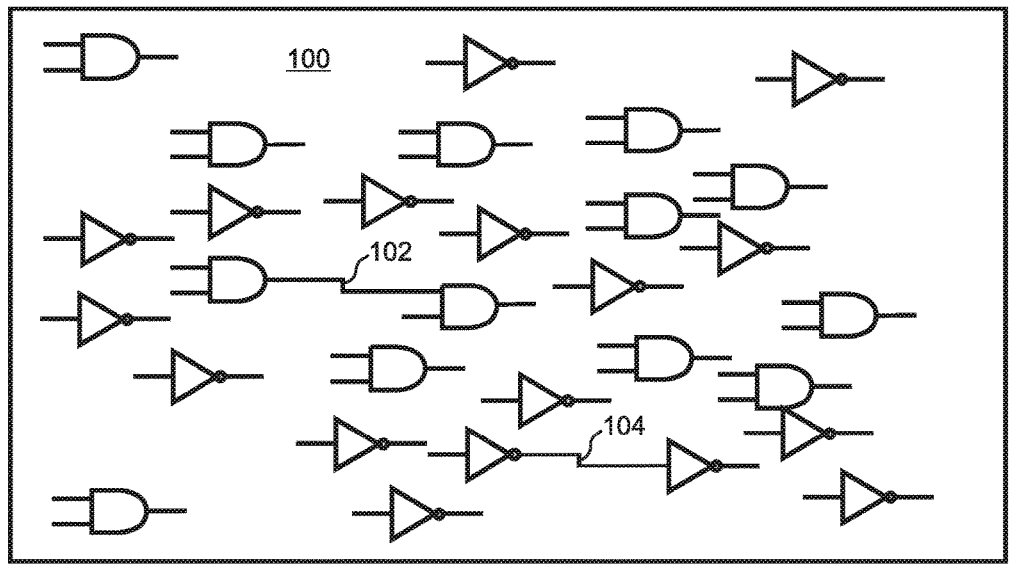
FIG. 1A is a simplified block diagram illustrating a digital integrated circuit of the prior art.
Figure 1B:
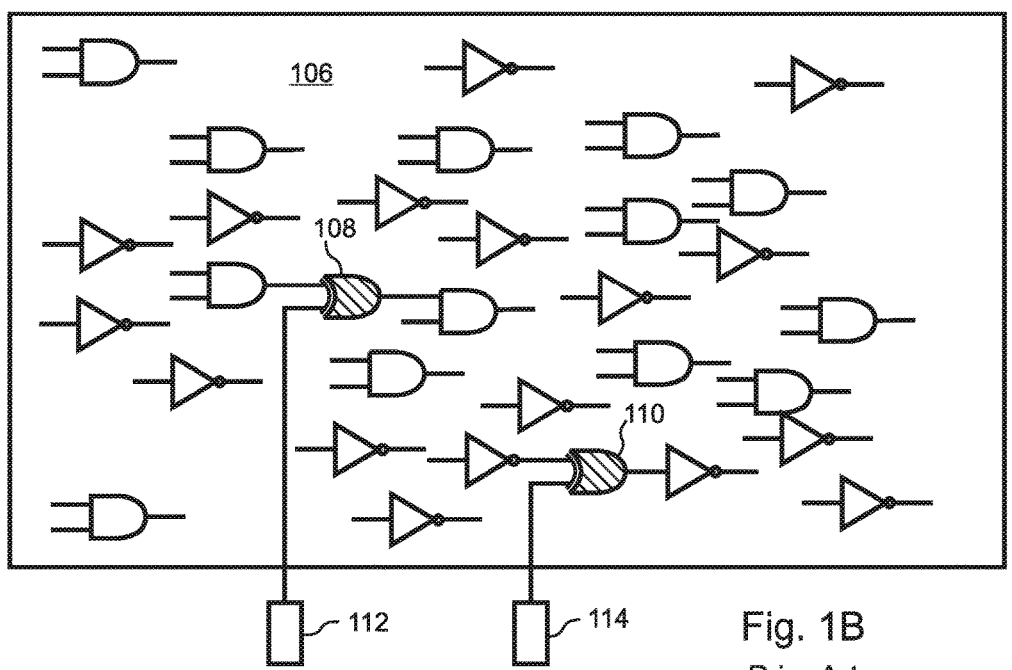
FIG. 1B is simplified block diagram illustrating a digital integrated circuit similar to FIG. 1A, but including disabling features intended to prevent unauthorized usage.
Figure 2B:
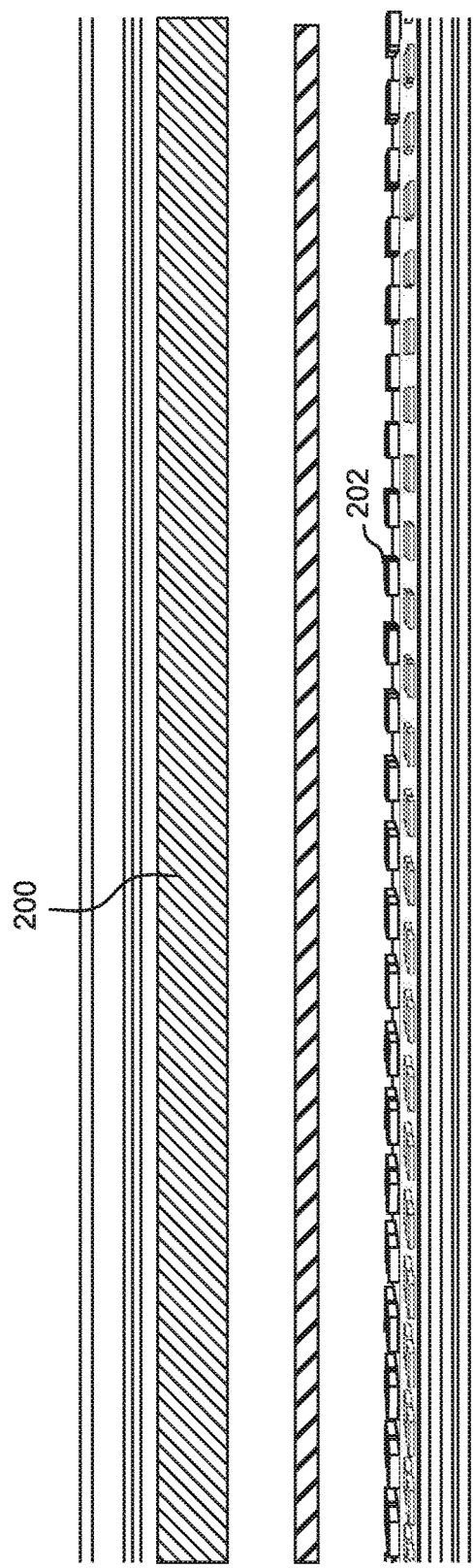
FIG. 2B is a cross-sectional side view of the PLL of FIG. 3A.
Figure 2C:
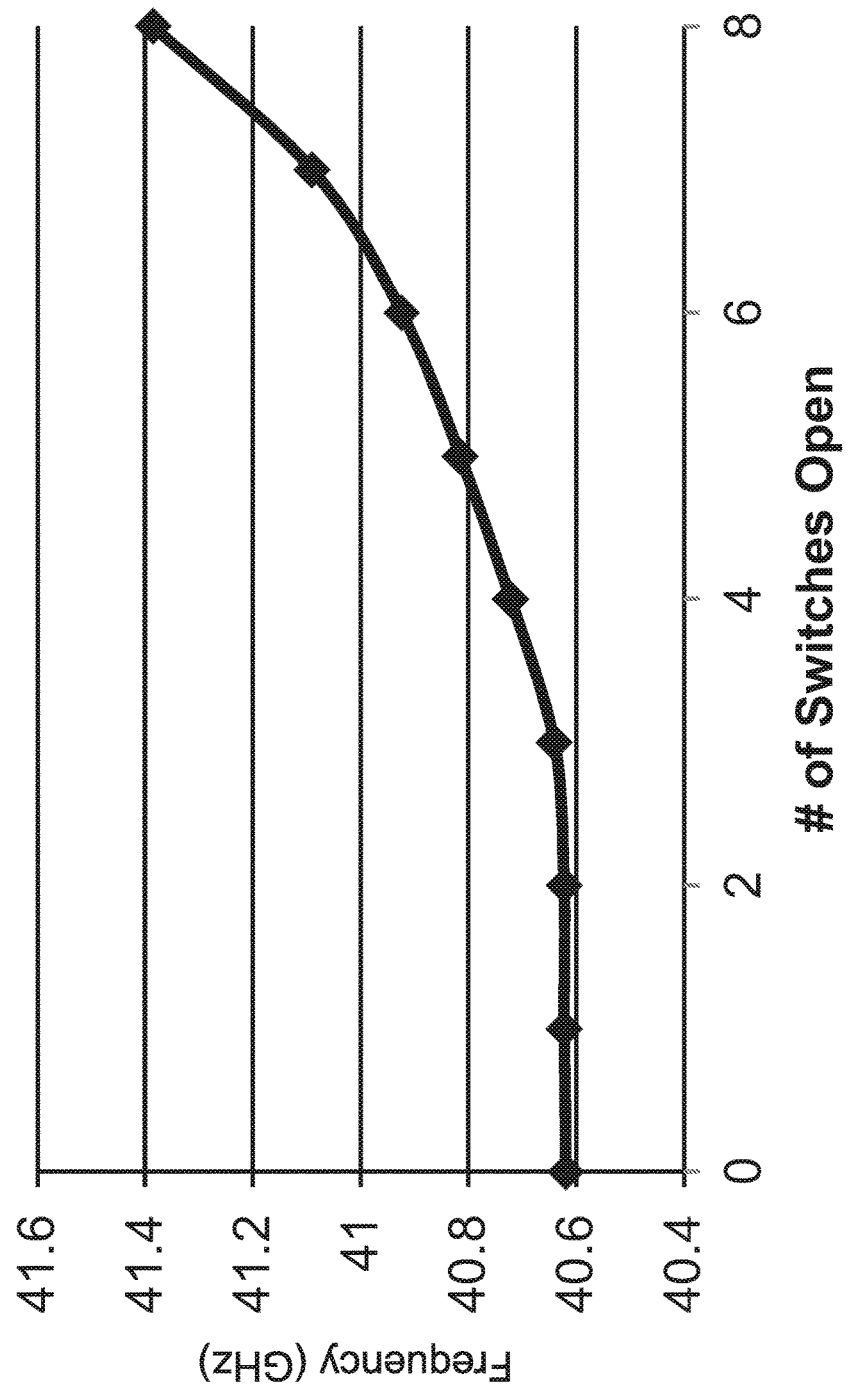
FIG. 2C is a graph of the output frequency as a function of the number of open control switches for the PLL of FIG. 3A.

For example, with reference to FIG. 2A, some embodiments include a phase locked loop ("PLL") with a resonant transmission line 200 that will only exhibit a required output frequency if it is properly adjusted by manipulating artificially tunable dielectric constants of passive components of the tank circuit. The resonant transmission line 200 of FIG. 2A includes a large number of "artificial dielectric" strips 202, each of which is independently controlled by a digital input bit so as to tune the dielectric constant of the substrate underneath the resonant transmission line and thereby control its resonant frequency. FIG. 2B is a cross sectional view from the side of the resonant transmission line 200 of FIG. 2A. FIG. 2C is a plot of the output frequency of an oscillator utilizing the digitally controlled resonant transmission line 200 as a function of the number of open switches applied to the dielectric strips.

Figure 3A:
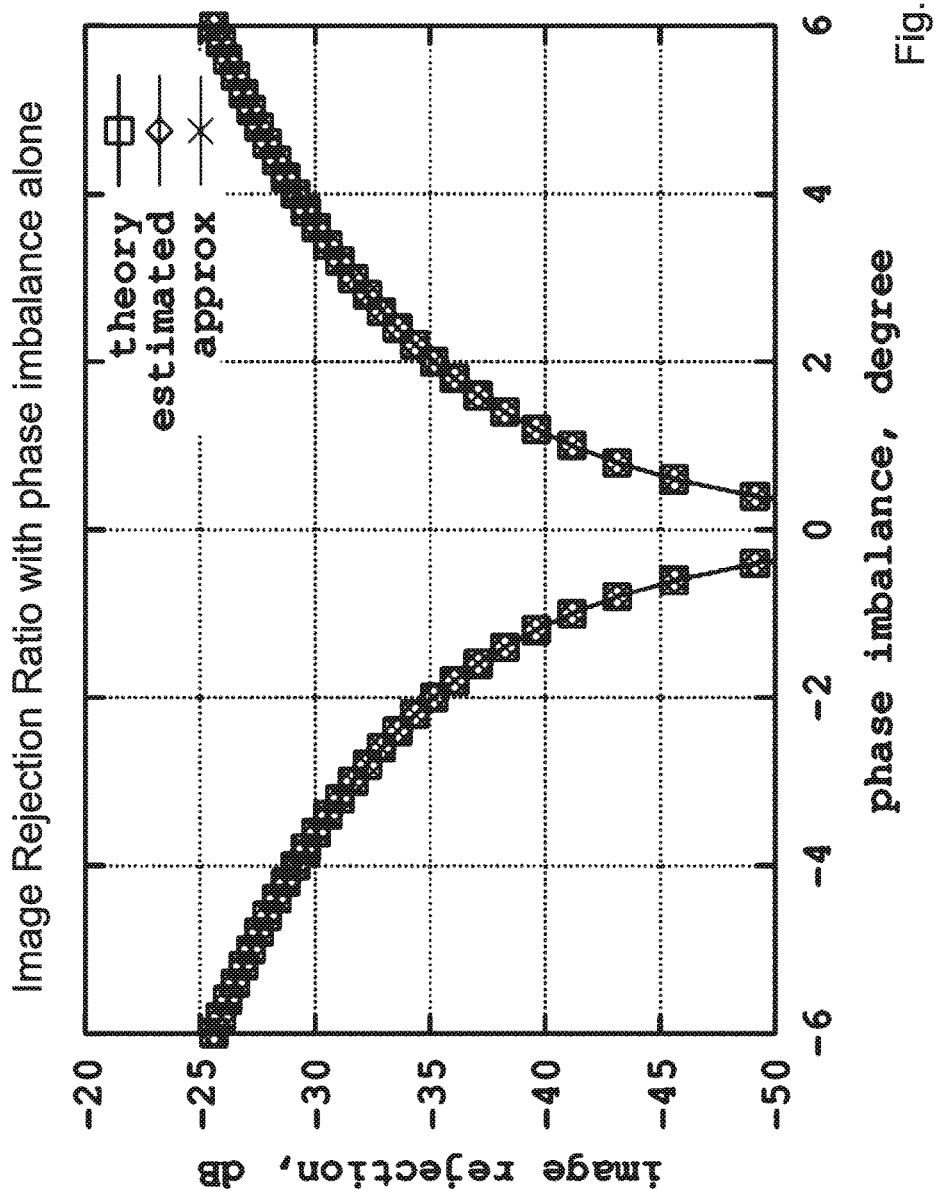
FIG. 3A is a graph that illustrates image-rejection ratio versus phase imbalance in a typical direct conversion receiver used in embodiments of the present disclosure.
Figure 3B:
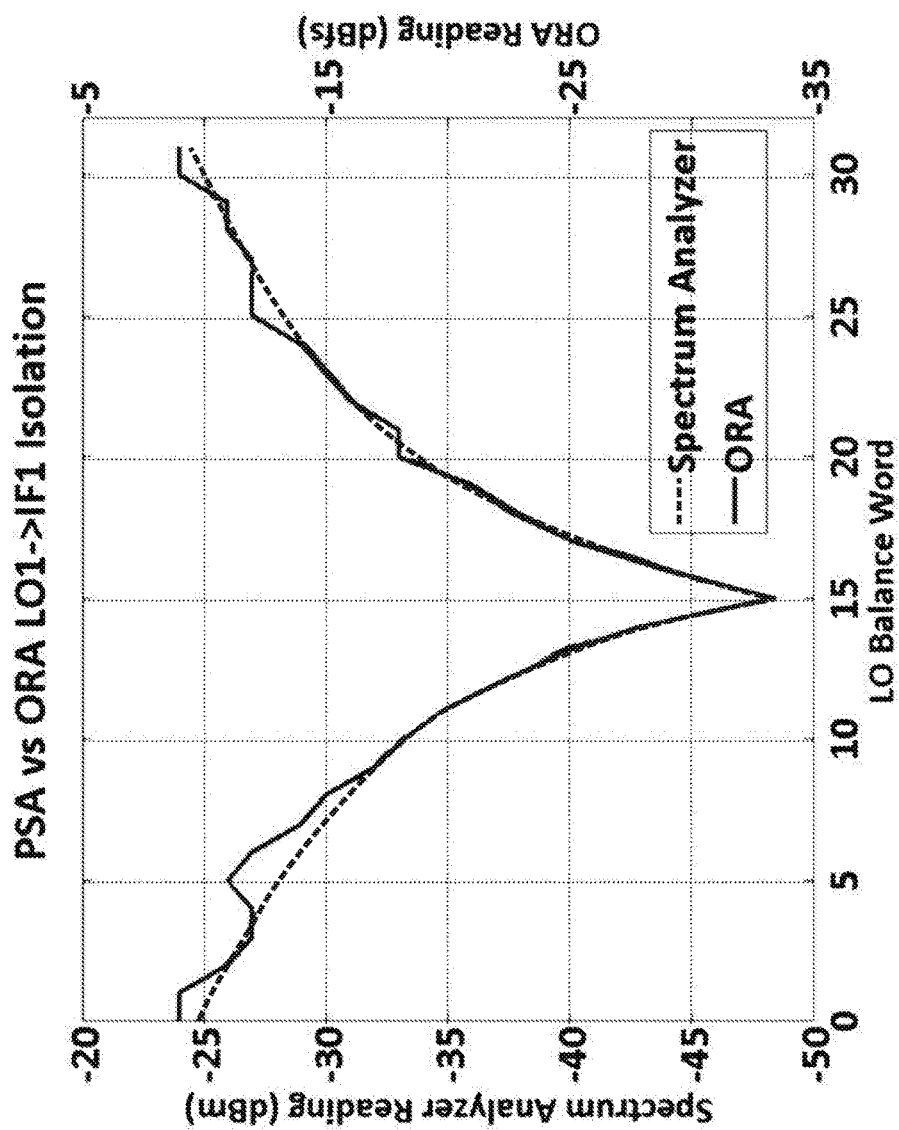
FIG. 3B is a graph that illustrates LO to IF spur isolation of an RF mixer used in embodiments of the present disclosure.

This fine-tuning of an AIC is typically a simple step to implement, because the analog circuits are designed to be close to their intended settings, such that the AIC will be functional, and the outputs of the AIC will be responsive, even before any adjustments are made. For example, FIG. 3A is a graph that illustrates the theoretical image-rejection ratio versus phase imbalance in a typical direct conversion receiver, and FIG. 3B is a graph that illustrates LO to IF spur isolation of an RF mixer as a function of a digital control word. In each case, there is a clear and sharp optimum, but at the same time the circuit is responsive over the entire range of adjustment.

Figure 3D:
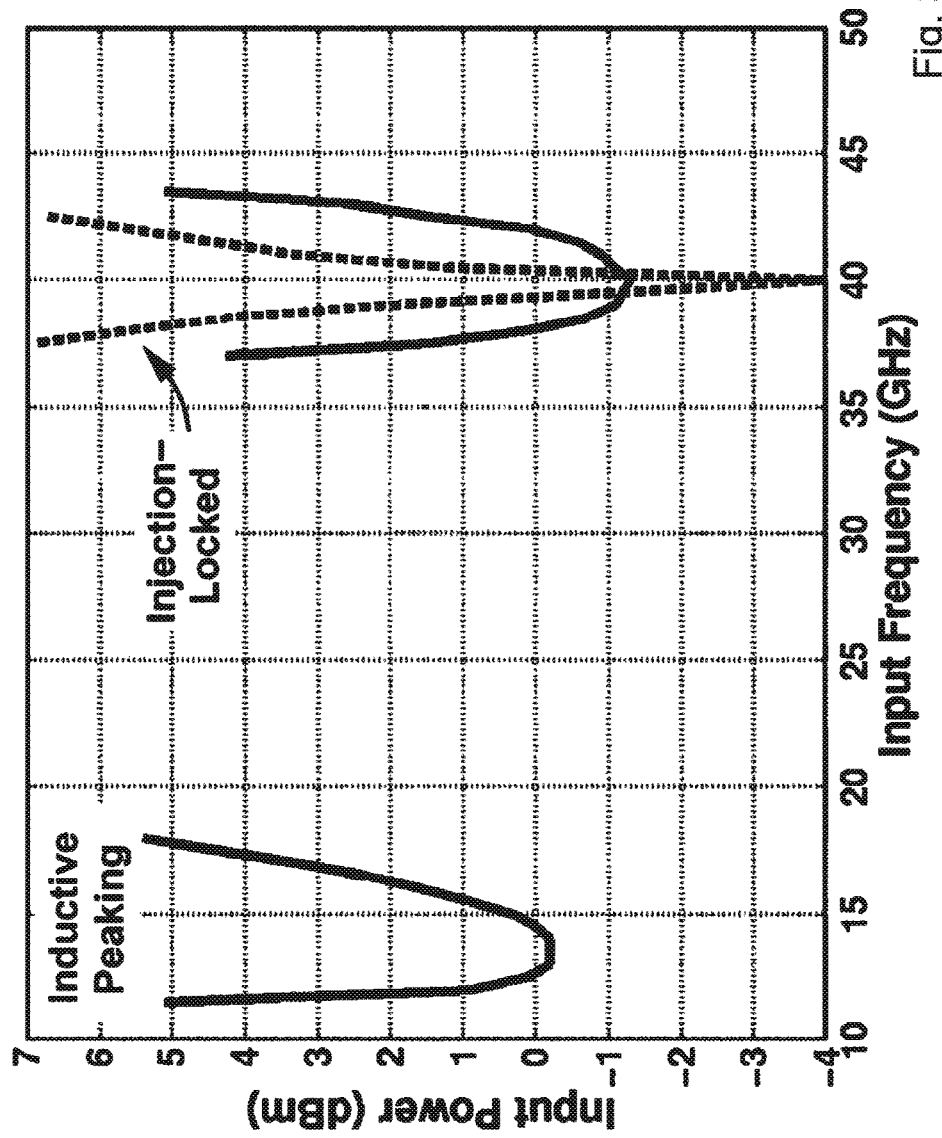
FIG. 3D is a graph that presents typical sensitivity curves for a frequency divider used in embodiments of the present disclosure.

In other cases, the output of an analog circuit may vary only over a portion of the full adjustment range. For example, FIG. 3C is a graph that presents an in-band third order input interception point ("IIP$_3$") measurement for an N-path mixer-first topology, while FIG. 3D is a graph that presents typical frequency divider sensitivity curves in terms of power versus frequency. Nevertheless, it is typical in the art to configure the design of an analog or mixed signal IC such that it will be near its optimal setting, and its output will be responsive, even before any adjustment is applied.

Embodiments of the invention include one or more features that deviate from these accepted practices in the art. Some embodiments significantly increase the adjustment ranges of the tuned analog circuits and purposely offsetting the pre-adjustment settings of the tuned analog circuits from their required values. As a result, the output, or outputs, of the AIC show little if any response as a function of the tuning inputs until the tuning inputs are brought close to their required values.

Various embodiments only provide external outputs that are required for operation of the AIC, making it more difficult to separately adjust each tuned analog circuit. For example, in some embodiments a plurality of tuned circuits are concatenated or arranged in series, with external access being provided only to the output of the final circuit in the series, which is substantially unresponsive until all of the tuned circuits in the series are properly tuned.

As a result of incorporating these unique features into the analog or mixed-signal AIC, the adjustment settings themselves function as a "key" that must be properly set so as to enable the AIC. If the adjustment settings are digital, then the higher order bits of the adjustments function as the key, while the lower bits continue be used for optimizing the function of the AIC once the higher bits have been properly set and the outputs have become responsive. In embodiments, the difficulty of "spoofing" the required adjustment settings requires a significant brute force effort on the part of the exploiter that is on par with a ground-up re-design of the AIC.

Figure 4A:
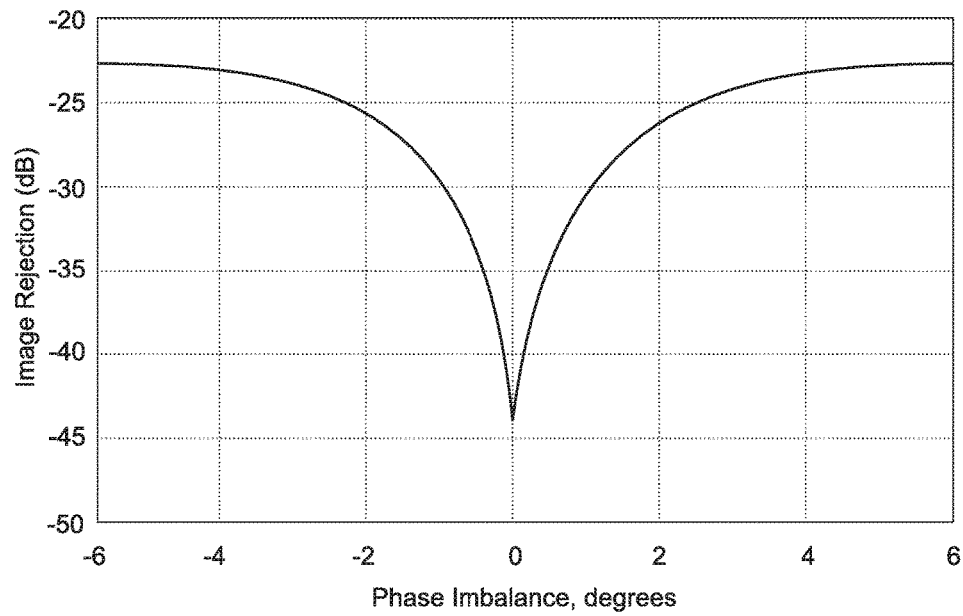
FIG. 4A is a graph that illustrates image-rejection ratio versus phase imbalance for a hypothetical image rejection filter similar to FIGS. 3A and 3B.
Figure 4B:
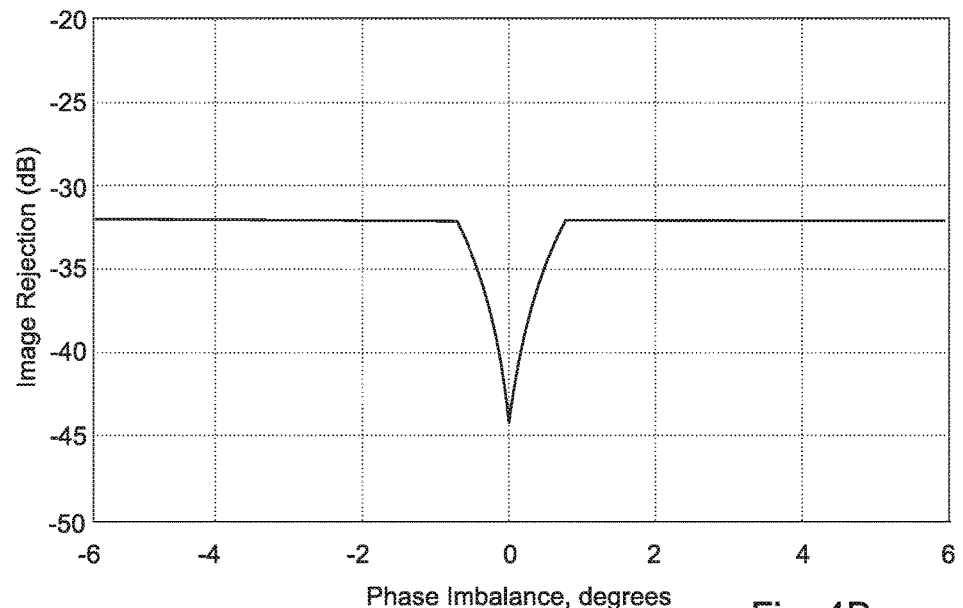
FIG. 4B is a graph that illustrates image-rejection ratio versus phase imbalance for a hypothetical image rejection filter similar to FIG. 4A, but including a clipping circuit that limits the rejection to no less than 32 dB.

With reference to FIGS. 4A and 4B, various embodiments of the disclosed method further include limiting or "clipping" circuits that "pin" the outputs of analog circuits to maximum or minimum values except when they are close to their tuned states, thereby eliminating any small variability in output that might otherwise be observed even when the circuit is badly miss-tuned. In the example of FIG. 4A, a hypothetical image rejection filter 500 similar to FIGS. 3A and 3B has a sharp band-pass tuning point at 35 GHz. However, the output is still responsive at +/−6 degrees of phase imbalance. In FIG. 4B, a clipping circuit has been added, which limits the rejection to no less than 32 dB, such that the output is unresponsive until the phase imbalance is less than about +/−1 dB.

In embodiments, information regarding the required adjustment input is delivered to the authorized user via an encryption mechanism so as to ensure that only the authorized user has the information necessary to properly adjust the AIC. In other embodiments, a separate chip that generates an enabling adjustment input is produced by an unrelated foundry and provided to the authorized user. This two IC approach ensures physical separation of the "lock" (included in the AIC) and "key" (included on a separate PROM or other chip).

Still other embodiments implement the highest order bits of a digital adjustment input for some or all of the analog adjustments as "fused" or "write-once" bits, whereby these high order bits need not be, and indeed cannot be, changed once they are initially written. For example, the AIC designer can obtain the analog or mixed signal AICs from an untrusted foundry, and then set the high order fused bits to their required values before shipping the AICs to end users, thereby placing each adjustment close to its required value and requiring only fine-tuning by the end user. This approach removes any requirement for end-users to support additional, unneeded adjustment bits, while at the same time imposing a significant penalty on any unauthorized party who might attempt to determine the required adjustment values by means of a "brute-force" search.

Figure 5:
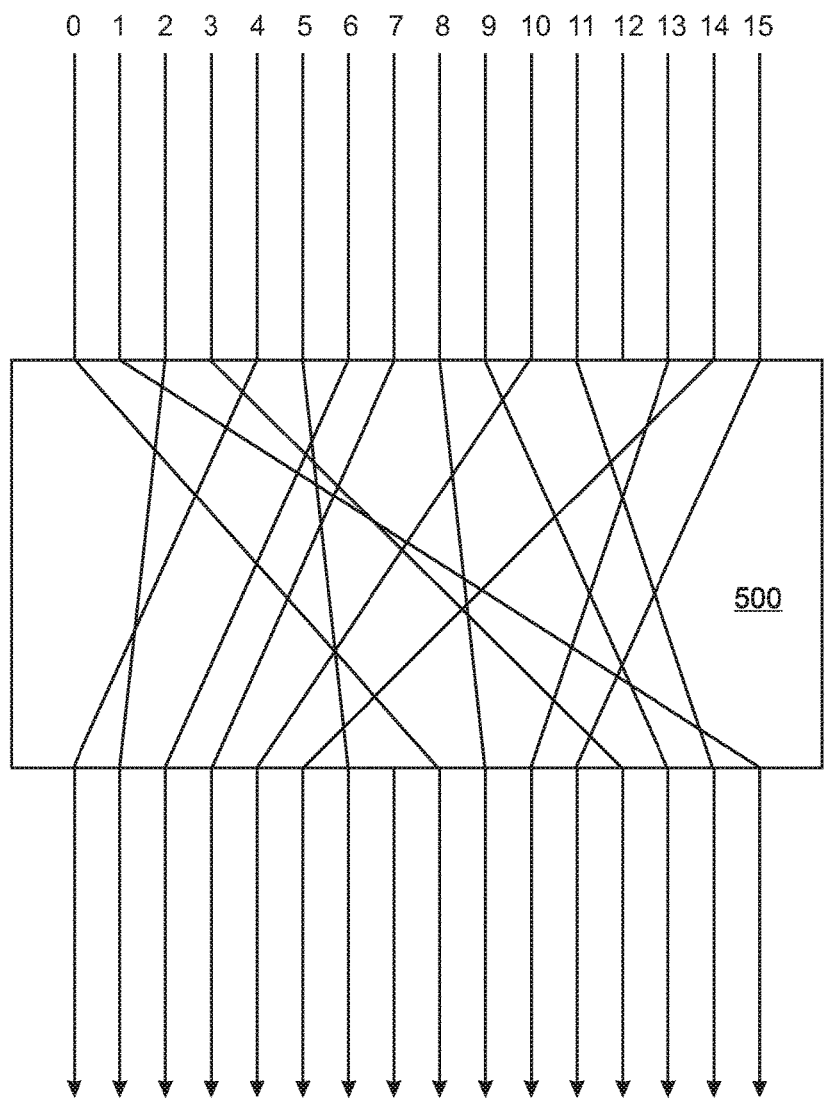
FIG. 5 is a simplified block diagram that illustrates randomizing of the adjustment bits in an embodiment of the present disclosure.

The difficulty of a brute force search for the required adjustment values for a digital adjustment input can be still further increased by "scrambling" the bits that control the various analog adjustments. With reference to FIG. 5, rather than simply arranging the adjustment bits in ascending or descending order, a "scrambling" circuit 500 can be used to rearrange the bits in a random, mixed order, so that continuous adjustment of tuning parameters is impossible unless the bit order is known. This approach does not impede normal adjustment of the AIC by authorized end users who know how the adjustment bits are ordered. However, if an unauthorized party is not aware, a priori, of the arrangement order of the adjustment bits, then even if by chance a certain setting is found for which some response from the AIC is obtained, considerable additional work will still be required before the ordering of the bits is established and the adjustment can be continuously varied and optimized.

Figure 6:
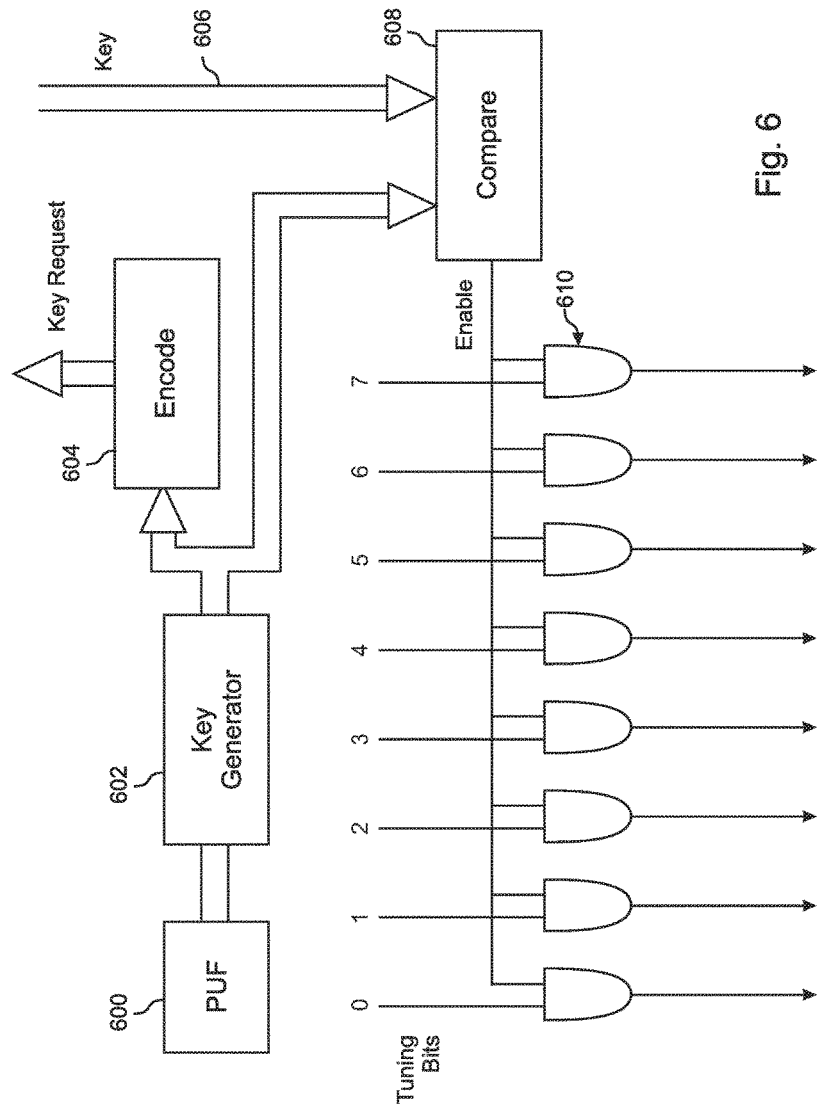
FIG. 6 is a block diagram of a disabling feature in an embodiment of the present disclosure that requires a digital key to enable the AIC.
Figure 7:
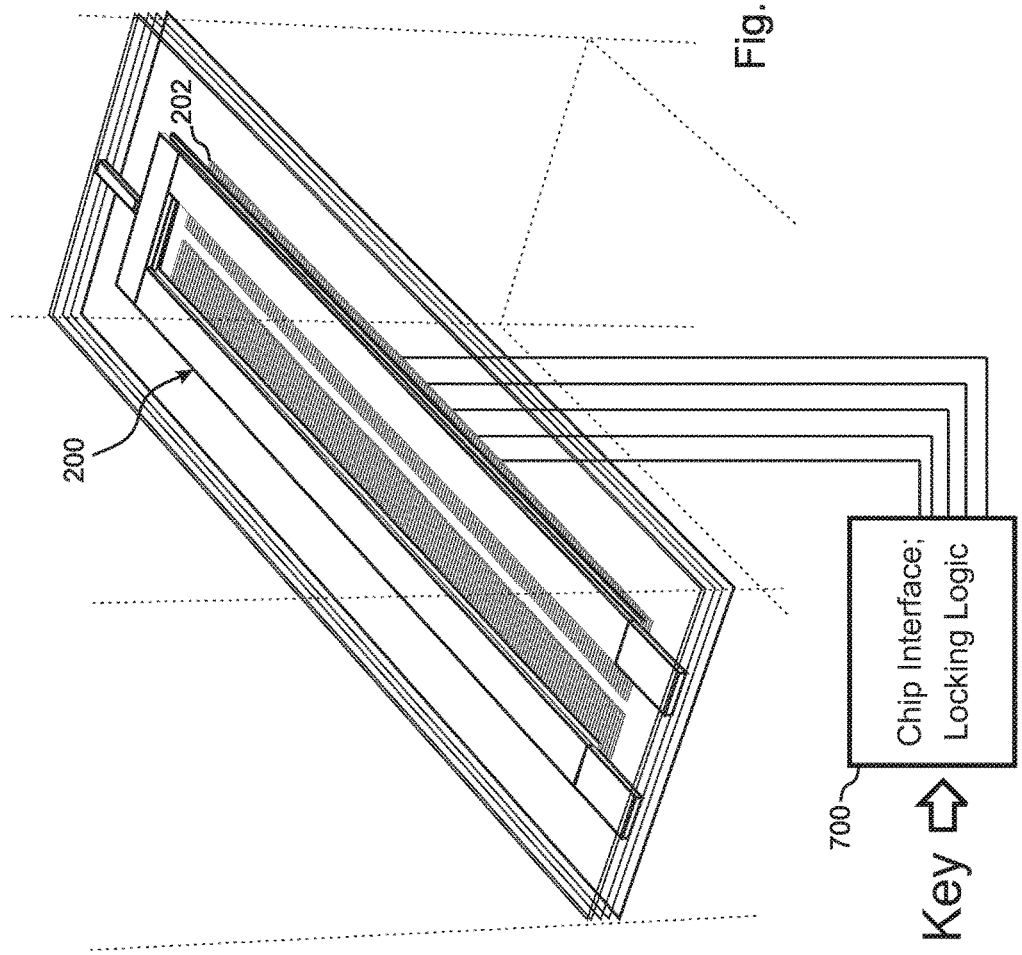
FIG. 7 is a perspective view of a tunable PLL similar to FIG. 2A but including interface logic that requires enablement by means of a key that provides inputs to a disabling feature of a chip interface.

For applications where some end users are not trusted and/or distribution of AICs to end users cannot be tightly controlled, embodiments include additional disabling features that depend upon "physically unclonable functions" ("PUF"s) that naturally vary from one AIC to the next. For example, with reference to FIG. 6, in some of these embodiments the adjustment input is disabled by special disabling feature 610 unless a specific digital key 606 is applied to the AIC. The required key is generated 602 based on a value supplied by a PUF 600, and a key request containing a coded version of the key 604 is provided to the end user. It then remains for the owner of the ICIP to decode the key request and provide the unique key to the authorized user. When the key 606 is provided to the AIC, it is verified 608 and the tuning bits are enabled. Even if a decoded key becomes available to unauthorized parties, it cannot be used to enable counterfeit or over-produced AICs, because the key is applicable to only one specific AIC. FIG. 7 illustrates enabling of the resonant transmission line 200 of FIGS. 2A-2D by means of a key that provides inputs to the disabling feature 700 of a chip interface.

Figure 8:
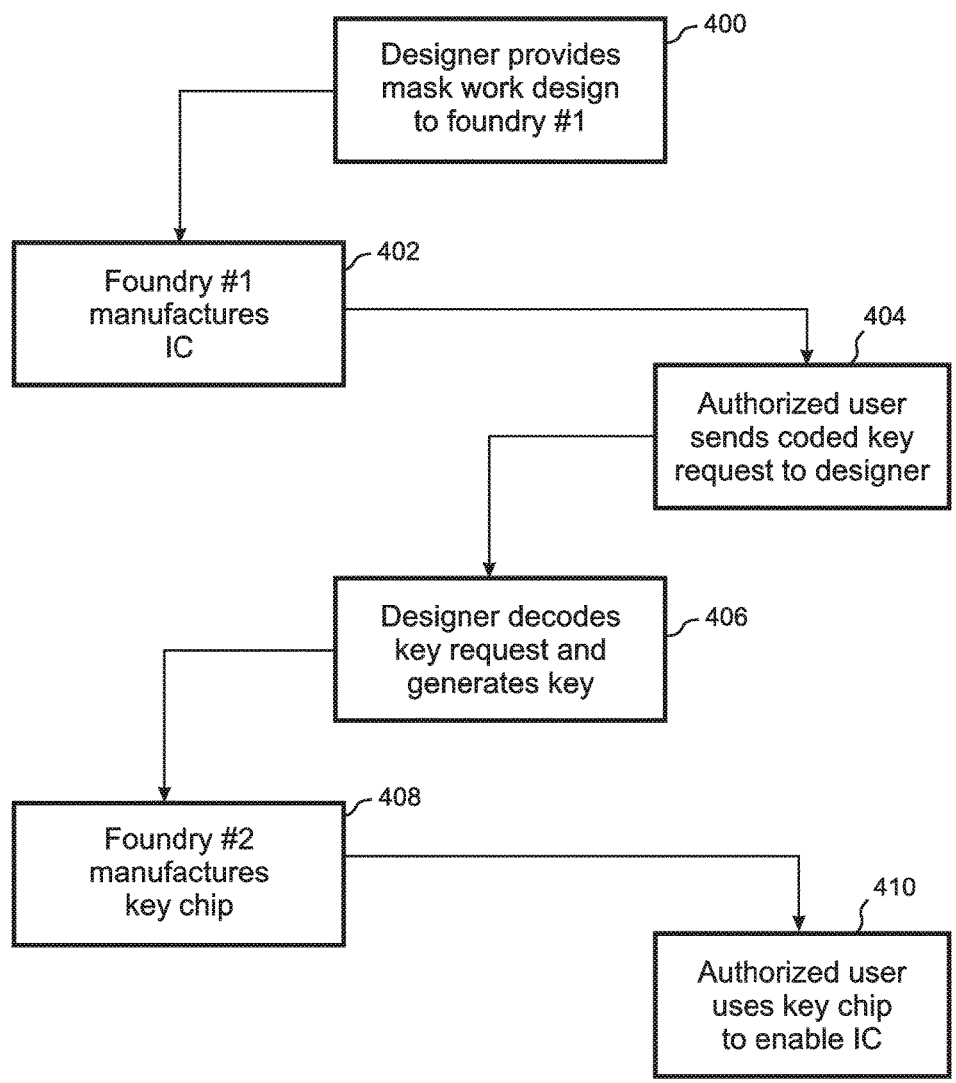
FIG. 8 is a flow diagram that illustrates a method that utilizes a physically unclonable feature in a two-chip embodiment of the present disclosure.

FIG. 8 is a flow diagram that illustrates this "PUF-key" method in a two-chip embodiment. According to the illustrated embodiment, the AIC designer designs an AIC and includes a disabling feature 700 that requires application of a "key" to function properly. The designer provides the mask work 800 (ICIP) for the AIC to a first foundry, which then manufactures the AIC 802 and delivers it to an authorized user 804. As in FIG. 6, the enabling key is generated with reference to a physically unclonable function ("PUF") included in the AIC design that naturally varies from one AIC to the next, such that each AIC requires a unique "key" input that is determined by the PUF for that AIC. Upon receipt of the AIC, the authorized user obtains a coded key request generated by the AIC and reports it to the AIC designer 804. The AIC designer then decodes the key request to determine the "key" input that is needed to enable the AIC 806 to function correctly 806. In various embodiments, this chip-specific key includes digital and/or analog inputs to the AIC.

Once the key has been determined, the designer transmits the key, in embodiments by encrypted means, to a second foundry 808, where a key chip is fabricated 408 that will provide the specific key needed by the AIC. The second foundry then delivers the key chip to the authorized user, who uses the key chip to retune the analog or mixed AIC 810, thereby enabling the AIC to function for its intended purpose. In similar embodiments, the key is fused into the AIC, either by the designer, by the foundry, or by the authorized user, so that a second chip is not required. In still other embodiments, for example if the key is purely digital, the key is simply provided to the authorized user in encrypted form, and the authorized user includes provisions within the design of a host apparatus for applying the key to the AIC.

Because the keys are chip-specific in various embodiments, counterfeit AICs, resulting for example from overproduction, cannot be used by unauthorized users. Even if an unauthorized user is able to obtain a key chip or a copy of the key information from an authorized user, it will not be applicable to an overproduced AIC because the key is chip specific. Accordingly, in some embodiments both the AICs and the key chips are manufactured by the same untrusted foundry. Because the cooperation of the designer is needed to generate the unique key for each AIC, the untrusted foundry is unable to produce functional keys for cloned or overproduced AICs.

Figure 9:
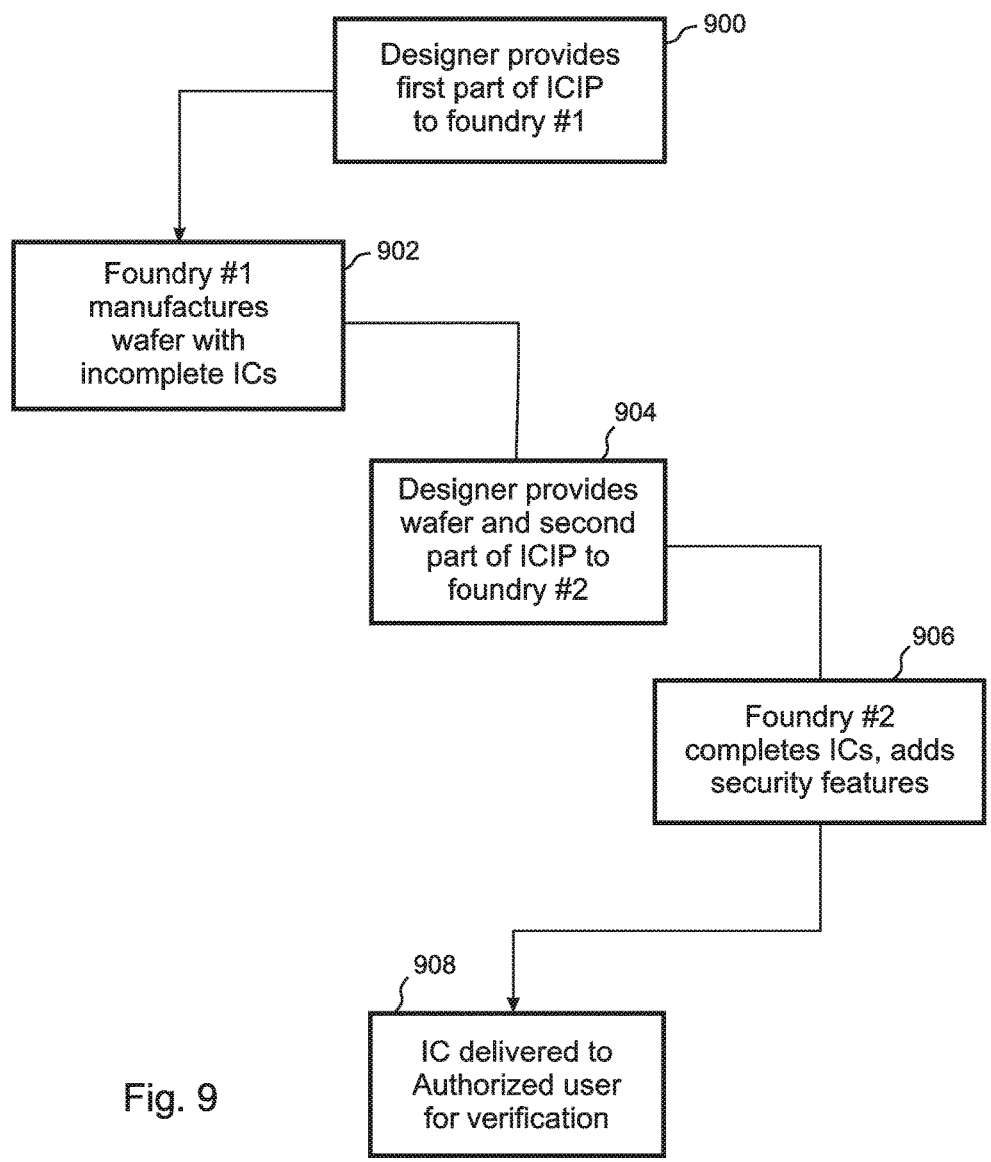
FIG. 9 is a flow diagram of a method in an embodiment of the present disclosure that utilizes two foundries to produce the AIC.

For embodiments that implement bit scrambling (e.g. FIG. 5), PUF key generation (e.g. FIGS. 6, 7, and 8), or any other strategy that might potentially be overcome or by-passed due to reverse engineering of the ICIP, the fabrication of the AIC can be divided into two steps, such that certain lower resolution protective features of the AIC can be omitted from the ICIP provided to a first, untrusted foundry and added instead in a second fabrication step performed by a second foundry. In particular, with reference to FIG. 9, the designer of the ICIP can divide the ICIP into two parts, such that the majority, but not all, of the mask work, which will typically be of high density, is delivered 900 to a first, untrusted foundry, where an unfinished wafer is produced 902. The wafer, together with mask work for the second part of the ICIP, which will typically be of lower density, is then delivered to a second foundry 904, which may be in-house or an otherwise trusted foundry. The second foundry then adds the top layer to the AICs 906 that scrambles the order of the adjustment bits, implements a PUF-driven key encoding scheme, and/or adds other security features to the AICs. The completed AICs are then delivered to the authorized user 908. In this way, the complete AICIP is not provided to either foundry, such that reverse engineering of the protective features becomes impossible for either foundry, unless the two foundries somehow collude with each other.

The foregoing description of embodiments has been presented for the purposes of illustration and description. Each and every page of this submission, and all contents thereon, however characterized, identified, or numbered, is considered a substantive part of this application for all purposes, irrespective of form or placement within the application.

The embodiments illustratively disclosed herein suitably may be practiced in the absence of any element which is not specifically disclosed herein and is not inherently necessary. However, this specification is not intended to be exhaustive.

Although the present application is shown in a limited number of forms, the scope of the disclosure is not limited to just these forms, but is amenable to various changes and modifications without departing from the spirit thereof. One of ordinary skill in the art should appreciate after learning the teachings related to the claimed subject matter contained in the foregoing description that many modifications and variations are possible in light of this disclosure. Accordingly, the claimed subject matter includes any combination of the above-described elements in all possible variations thereof, unless otherwise indicated herein or otherwise clearly contradicted by context. In particular, the limitations presented in dependent claims below can be combined with their corresponding independent claims in any number and in any order without departing from the scope of this disclosure, unless the dependent claims are logically incompatible with each other.

What is claimed is:

1. A method for preventing unauthorized use of an analog or mixed signal integrated circuit, the method comprising:
   causing an analog or mixed circuit IC ("AIC") to be produced according to an AIC design,
      said AIC including at least one AIC output,
      said AIC including an analog or mixed signal circuit having a circuit output that is adjustable by application of an adjustment signal to an adjustment input of the AIC,
      the adjustment input being configured to accept any adjustment to signal within an adjustment signal range,
      the analog AIC being substantially inoperative and the AIC outputs being substantially invariant in response to applied adjustment signals that are not enabling signals, where an enabling signal is an adjustment signal that falls within an enabling subrange of the adjustment range,
      at least one of the AIC outputs being variable in response to applied enabling signals, and
      the enabling subrange being less than 10% of the adjustment range;
   causing the AIC to be delivered to an authorized user; and
   enabling the authorized user to apply an enabling signal to the adjustment input of the AIC.

2. The method of claim 1, wherein failure to apply an adjustment signal to the AIC is equivalent to applying a "null" adjustment signal, said null adjustment signal being outside of the enabling subrange.

3. The method of claim 1, wherein the AIC includes a plurality of adjustable analog or mixed signal circuits, all of which are adjusted by the adjustment signal.

4. The method of claim 3, wherein a plurality of the analog or mixed signal circuits are interdependent, such that a corresponding AIC output is inoperative unless all of the interdependent analog or mixed-signal circuits are adjusted to within respective enabled adjustment ranges by application of the enabling signal.

5. The method of claim 1, wherein enabling the authorized user to apply an enabling signal includes providing information to the authorized user regarding the enabling subrange.

6. The method of claim 5, wherein the information regarding the enabling subrange is provided to the authorized user using a secure method.

7. The method of claim 1, wherein enabling the authorized user to apply an enabling signal includes providing to the authorized user an enabling IC that is configured to apply an enabling signal to the AIC.

8. The method of claim 7, wherein the AIC is produced by a first foundry, and the enabling IC is produced by a second foundry that is distinct from the first foundry.

9. The method of claim 1, wherein enabling the authorized user to apply an enabling signal includes causing the AIC to be altered such that the adjustment input is only able to accept enabling signals.

10. The method of claim 9, wherein the adjustment signals are digital signals, and altering the AIC includes setting selected bits of the adjustment input to fixed values.

11. The method of claim 1, wherein the AIC further includes a clipping circuit that maintains a fixed circuit output except when an enabling signal is applied to the adjustment input.

12. The method of claim 1, wherein the AIC further includes a security feature that increases a difficulty of determining by an unauthorized entity of the enabling subrange.

13. The method of claim 12, wherein the adjustment signal is a digital signal, and the security feature includes a circuit that reorders bits of the adjustment input.

14. The method of claim 12, wherein the adjustment signal is a digital signal, and the security feature causes at least one bit of the adjustment input to be settable only once by the user, after which the at least one bit remains permanently set.

15. The method of claim 12, wherein the security feature is configured to require that an enabling input be applied to the AIC, the enabling input being specific to the AIC, such that the enabling input cannot be used to enable other, nominally identical AICs.

16. The method of claim 12, wherein the security feature includes a physically unclonable feature ("PUF") of the AIC.

17. The method of claim 1, wherein causing the analog or mixed circuit IC ("AIC") to be produced includes causing an unfinished AIC to be produced by a first foundry, and causing the unfinished AIC to be completed by a second foundry, such that the AIC design is not fully known to either the first foundry or the second foundry.

18. The method of claim 17, wherein completing the unfinished AIC includes adding a security feature to the AIC that increases a difficulty of determining by an unauthorized entity of the enabling subrange.

19. The method of claim 1, wherein the enabling signal includes a digital signal.

20. The method of claim 1, wherein the enabling signal includes an analog signal.

21. The method of claim 1, wherein the AIC design requires that the enabling signal must be applied continuously during use of the AIC.

22. An analog or mixed signal integrated circuit ("AIC") that inhibits unauthorized use thereof by requiring application thereto of an enabling signal, the AIC comprising:
at least one AIC output; and
an analog or mixed signal circuit having a circuit output that is adjustable by application of an adjustment signal to an adjustment input of the AIC,
the adjustment input being configured to accept any adjustment signal within an adjustment signal range,
the analog AIC being substantially inoperative and the AIC outputs being substantially invariant in response to applied adjustment signals that are not enabling signals, where an enabling signal is an adjustment signal that falls within an enabling subrange of the adjustment range,
at least one of the AIC outputs being variable in response to applied enabling signals, and
the enabling subrange being less than 10% of the adjustment range.

* * * * *